United States Patent [19]
Norsworthy et al.

[11] Patent Number: 5,530,442
[45] Date of Patent: Jun. 25, 1996

[54] CIRCUIT AND METHOD FOR TESTING A DITHERED ANALOG-TO-DIGITAL CONVERTER

[75] Inventors: Steven R. Norsworthy, Emmaus, Pa.; David A. Rich, Woodmere, N.Y.; Robert W. Walden, Bethlehem, Pa.

[73] Assignee: AT&T Corp., Murray Hill, N.J.

[21] Appl. No.: 239,644

[22] Filed: May 9, 1994

[51] Int. Cl.⁶ .................................................. H03M 1/20
[52] U.S. Cl. ........................................ 341/131; 341/155
[58] Field of Search .................................. 341/131, 120, 341/143, 155

[56] References Cited

U.S. PATENT DOCUMENTS

| | | | |
|---|---|---|---|
| 5,144,308 | 9/1992 | Norsworthy | 341/131 |
| 5,341,135 | 8/1994 | Pearce | 341/120 |

OTHER PUBLICATIONS

"Effective Dithering of Sigma–Delta Modulators" by S. R. Norsworthy, pp. 1304–1307, 1992 IEEE International Symposium on Circuits and Systems, Sheraton Hotel, San Diego, CA, May 10–13, 1992.

Audio Engineering Society 95th Convention Oct. 7–10, 1993, Preprint No. 3711 (B1 PM 2) "Idle Channel Tones and Dithering in Delta–Sigma Modulators", pp. 1–34, S. R. Norsworthy and D. A. Rich, AT&T Bell Labs., Allentown, PA.

"Oversampling Methods for A/D and D/A Conversion", J. C. Candy and G. C. Temes, IEEE Press, 1992, pp. 139–149.

"Oversampled, Linear Predictive and Noise–Shaping Coders of Order N 1," by S. K. Tewksbury and R. W. Hallock, IEEE Transactions on Circuits and Systems, vol. CAS–25, No. 7, Jul. 1978, pp. 139–149.

"Optimal Nonrecursive Noise Shaping Filters for Oversampling Data Converters, Part 1: Theory, Part 2: Applications," AT&T Bell Labs., Allentown, PA, IEEE Proc. ISCAS'93, vol. 2, pp. 1353–1360, May 1993.

*Primary Examiner*—Brian K. Young

[57] ABSTRACT

A device comprises: an analog-to-digital converter; a digital signal processor; a digital dither signal generator; and a signal coupling device adapted to selectively couple one of the dither signal generator and the digital signal processor to the signal path in the converter. A method of testing a dithered analog-to-digital converter employing an M-bit digital signal generator, M being a positive integer, comprises the steps of: generating an M-bit, periodic signal; providing the generated signal to the dithered converter at a point along the signal path of the dithered converter in place of the dither signal; and measuring the digital output signal produced by the converter.

23 Claims, 3 Drawing Sheets

CIRCUIT AND METHOD FOR TESTING A DITHERED ANALOG-TO-DIGITAL CONVERTER

TECHNICAL FIELD

The invention relates to producing dithered signals to reduce periodic noise and spurious tones in general and, more particularly, to testing such dithered signal production techniques.

BACKGROUND OF THE INVENTION

Analog-to-digital conversion, which may include oversampling or shaping the quantization noise of a digital signal, is well-known and has a wide variety of applications, including digital audio, digital telephony, and digital instrumentation, to name only a few. Analog-to-digital conversion is discussed, for example, in "Oversampling Methods for A/D and D/A Conversion," by James C. Candy and Gabor C. Temes, appearing in the text *Oversampling Delta-Sigma Data Converters: Theory, Design and Simulation,* edited by James C. Candy and Gabor C. Temes, and published by IEEE Press (1992), "Oversampled, Linear Predictive and Noise-Shaping Coders of Order N>1," by Stuart K. Tewksbury and Robert W. Hallock, and appearing in the aforementioned Candy and Temes text, "Optimal Nonrecursive Noise Shaping Filters for Oversampling Data Converters, Part 1: Theory" and "Optimal Nonrecursive Noise Shaping Filters for Oversampling Data Converters, Part 2: Applications" by Steven R. Norsworthy, appearing in IEEE Proc. ISCAS '93, Vol. 2, pp 1353–1360, May 1993, and "Idle Channel Tones and Dithering in Delta-Sigma Modulators," by Steven R. Norsworthy and David A. Rich, presented at the 95th Convention of the Audio Engineering Society, Oct. 7–10, 1993, all of the foregoing being herein incorporated by reference.

U.S. Pat. No. 5,144,308, entitled "Idle Channel Tone and Periodic Noise Suppression for Sigma-Delta Modulators Using High-Level Dither," by Steven R. Norsworthy, issued Sep. 1, 1992, assigned to the assignee of the present invention and herein incorporated by reference, discloses a technique for using a digitally generated dither signal to improve the performance of a sigma-delta modulator by reducing the amount of periodic noise and spurious tones generated in the converter output signal. A need exists to ensure that the dither signal generator is operating as intended and is having the desired effect on the output signal produced by the analog-to-digital converter; that is, a need exists to monitor or test the dither signal path.

SUMMARY OF THE INVENTION

Briefly, in accordance with one embodiment of the invention, a circuit comprises: an analog-to-digital converter; a digital signal processor; a digital dither signal generator; and a signal coupling device adapted to selectively couple one of the dither signal generator and the signal processor to the signal path in the converter. A method of testing a dithered analog-to-digital converter employing an M-bit digital dither signal generator, M being a positive integer, comprises the steps of: generating an M-bit, periodic signal; providing the generated signal to the dithered converter at a point along the signal path of the dithered converter in place of the dither signal; and measuring the digital output signal produced by the converter.

BRIEF DESCRIPTION OF THE DRAWING

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

As previously discussed, aforementioned U.S. Pat. No. 5,144,308, assigned to the assignee of the present invention, describes use of a digitally generated dither signal to improve the performance of a sigma-delta modulator analog-to-digital converter by reducing the amount of periodic noise and spurious tones generated in the output signal of the converter. A need thus exists to ensure that the dither signal generator is operating as intended and having the desired effect on the output signal produced by the analog-to-digital converter; that is, a need exists to monitor or test the dither signal path.

Figure 1:
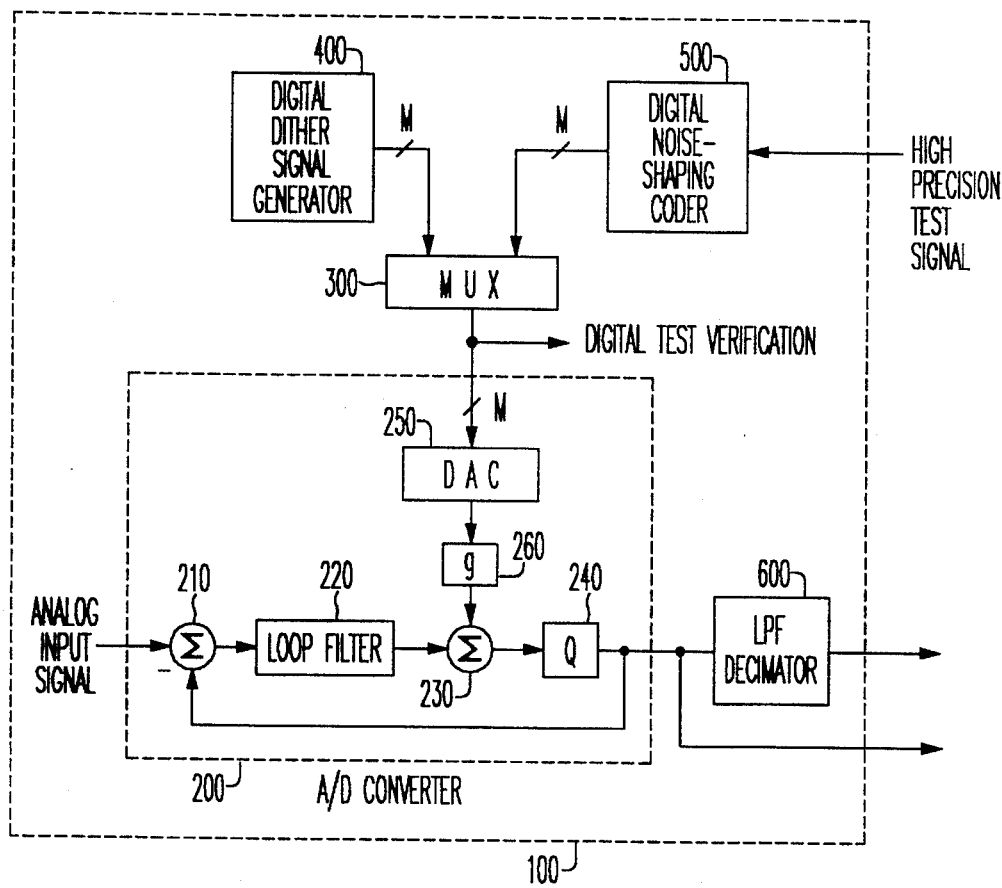
FIG. 1 is a block diagram illustrating one embodiment of a device for testing a dithered analog-to-digital converter in accordance with the invention.

FIG. 1 is a block diagram illustrating one embodiment of a device or circuit for testing a dithered analog-to-digital converter in accordance with the invention. As illustrated in FIG. 1, in an analog-to-digital converter that is dithered, such as converter 200, a digitally produced dither signal may be provided to a digital-to-analog converter (DAC) in the primary or forward signal path of the analog-to-digital converter, such as DAC 250 in FIG. 1. It is generally difficult to determine whether the dither generator is operating as desired simply by monitoring or measuring the digital output signal produced by analog-to-digital converter 200. This is due, at least in part, to the pseudorandom nature of the dither signal produced. Likewise, monitoring the output signal of the dither generator directly, such as illustrated by the digital test verification path in FIG. 1, will not completely address the integrity of the dither signal path in the dithered analog-to-digital converter. A further complication derives from the fact that the DAC, such as DAC 250 in FIG. 1, or the quantizer, such as conventional quantizer 240 in FIG. 1, may each introduce harmonic distortion along the dither signal path making it difficult to observe the dither signal in the output signal of the analog-to-digital converter.

An embodiment of a testable dithered analog-to-digital converter 100 in accordance with the invention is illustrated in FIG. 1 and comprises: an analog-to-digital converter, such as converter 200; a digital signal processor that includes a quantizer and produces a quantized signal, such as digital signal processor 500; a digital dither signal generator, such as generator 400; and a signal coupling device adapted to selectively couple the dither signal generator or the digital signal processor including a quantizer to the converter signal path, such as device 300. As illustrated, in this particular embodiment the dither signal generator and the digital signal processor including a quantizer are each adapted to produce M-bit digital signals, M being a positive integer. Likewise, in this particular embodiment, the digital signal processor including a quantizer obtains an N-bit, externally-derived, high precision periodic signal, N being a positive integer greater than M, and employs noise-shaping to generate the M-bit signal. Thus, the signal generator and the digital signal processor operate in conjunction with M-bit DAC 250, illustrated within analog-to-digital converter 200 in this particular embodiment. Although FIG. 1 illustrates analog-to-digital converter 200 as a sigma-delta modulator, the invention is not restricted in scope in this respect. Any analog-to-digital converter having a dither signal provided along the signal path of the analog-to-digital converter may be employed. FIG. 1 also illustrates a decimator 600, typically implemented by a low-pass filter (LPF), coupled to the output port of converter 200, although this is also not necessary and may be omitted from alternative embodiments of a testable-dithered analog-to-digital converter in accordance with the invention.

As illustrated in FIG. 1, in this particular embodiment digital signal processor 500 comprises a digital noise-shaping coder, such as a sigma-delta modulator, receiving a high-precision input test signal from an externally-derived source, although the scope of the invention is also not limited in this respect. It will be understood, for example, that the invention is not restricted in scope to any particular embodiment of a digital signal processor that includes a quantizer, such as a digital noise-shaping coder. Thus, any embodiment of a digital signal processor that includes a quantizer in which an N-bit digital input signal is obtained and requantized to provide an M-bit digital output signal, M and N being positive integers and M being less than N, will suffice. Likewise, in an embodiment employing a digital noise-shaping coder, for example, the digital noise-shaping coder may comprise, without limitation, a sigma-delta modulator. Likewise, the digital noise-shaping coder may include a conventional quantizer of any number of bits, such as a one-bit coder or a multi-bit coder. Likewise, the digital noise-shaping coder may have a filter of any order in its feedback path, its feed forward path, or both, and, in addition, it may have multiple feed forward loops, multiple feedback loops, or both. Furthermore, the digital noise-shaping coder may be multi-staged or cascaded. Thus, in general, depending on the particular application, in such an embodiment, any digital noise-shaping coder will suffice. Moreover, in the context of the invention, digitally shaping the quantization noise refers to a process whereby the power spectral density associated with the quantization error is shaped by digital filtering so that at least a portion of the amount of noise energy present over a predetermined range of relevant frequencies is reduced.

As illustrated in FIG. 1, in this particular embodiment, analog-to-digital converter 200 comprises an accumulator 210, a signal filter 220 to perform noise-shaping, an accumulator 230, and a conventional quantizer 240. Likewise, as illustrated in FIG. 1, signal coupling device 300, illustrated in this particular embodiment as a multiplexer or MUX, is coupled to DAC 250. DAC 250 is coupled to the primary or forward signal path of analog-to-digital converter 200, immediately ahead of quantizer 240, via accumulator 230. Likewise, as illustrated in FIG. 1, the digital output signal produced by quantizer 240 is fed back to accumulator 210 so that it may be used to offset the analog signal provided as an input signal to analog-to-digital converter 200. Of course, the feedback path will therefore include a digital-to-analog converter, such as a switched capacitor (not shown) in actual implementation.

Figure 2:
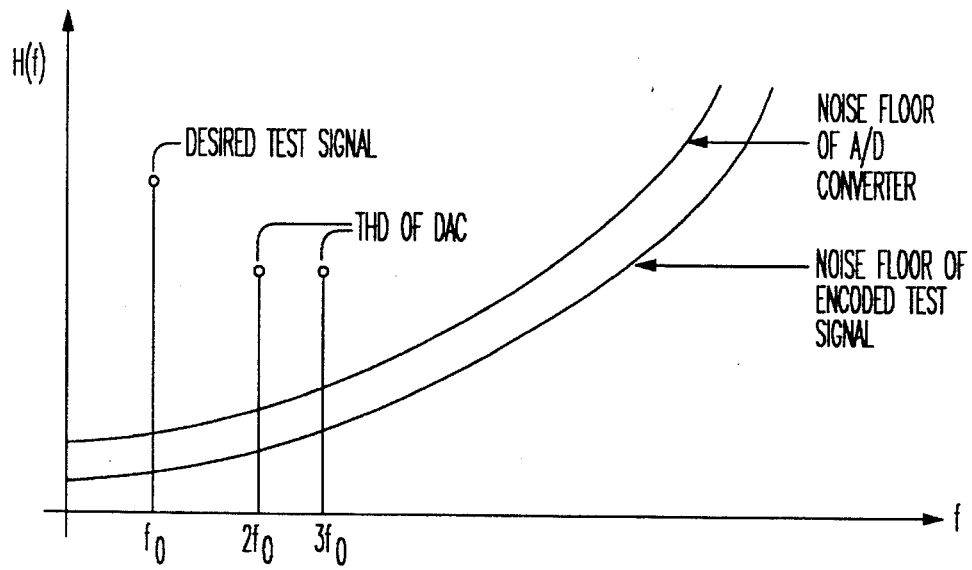
FIG. 2 is a plot illustrating a frequency spectrum that may be produced by employing a method of testing a dithered analog-to-digital converter in accordance with the invention.

As described in aforementioned U.S. Pat. No. 5,144,308, and as illustrated in FIG. 1, a signal path gain, g, designated 260 in FIG. 2, is applied to the dither signal propagating along the dither signal path. This signal path gain may be calculated based on the formula for the normalized AC power of the dither signal provided in U.S. Pat. No. 5,144,308. As further described in the aforementioned U.S. Pat. No. 5,144,308, the normalized AC power may be calculated based, at least in part, on the step size of the quantizer, such as quantizer 240 illustrated in FIG. 1. It will, of course, be appreciated that the invention is not restricted to a quantizer of any particular number of bits. Therefore, for example, satisfactory operation may be achieved for a second-order sigma-delta modulator with a gain selected or calculated to be at least about one-half of the step size of the quantizer, such as described in aforementioned U.S. Pat. No. 5,144,306 with respect to the normalized AC power.

As previously described, in this particular embodiment digital signal processor 500 may comprise a digital noise-shaping coder, although the invention is not limited in this respect. Where digital signal processor 500 comprises a digital noise-shaping coder, the coder is employed to generate a digitally encoded, noise-shaped, periodic test signal that may be provided to DAC 250 via MUX 300, as an alternative to the signal produced by dither signal generator 400. Thus, digital signal processor 500 may be used in accordance with the present invention to provide a device and method for testing a dithered analog-to-digital converter, such as converter 200.

As illustrated in FIG. 1, an embodiment of a device and method for testing a dithered analog-to-digital converter in accordance with the invention is to provide a test signal, such as a sine wave, that is generated via noise-shaping and therefore substantially free of distortion. As explained in more detail hereinafter, this particular approach improves the capability to resolve the dither signal in the output signal of the analog-to-digital converter by reducing the potential for harmonic distortion. Therefore, in this particular embodiment, spectrally analyzing the output signal of the analog-to-digital converter produced by the test signal should provide information regarding harmonic distortion due to the DAC itself, or due to the analog-to-digital converter, whose distortion characteristics may already be known, such as through testing. Thus, an advantage of this particular embodiment of the device and method described is that it also provides a technique to observe the distortion of the DAC in addition to verifying the integrity of the dither signal path.

FIG. 2 is a plot illustrating a frequency spectrum that may be produced by analyzing the spectrum of the output signal produced by the embodiment illustrated in FIG. 1. FIG. 2 illustrates the noise floor of the encoded test signal below the noise floor of analog-to-digital converter 200. This may occur, for example, where the order of the filter of digital signal processor 500, such as where it comprises, for example, a digital noise-shaping coder, is above that of the loop filter within the analog-to-digital converter, such as converter 200. Alternatively, gain 260, g, may be selected to ensure this relative placement of the respective noise floors even where the loop filters within converter 200 and digital signal processor 500 have the same order. As illustrated in FIG. 2, the spectrum of the test signal is periodic and has at least one dominant spectral component, namely $f_o$ in this particular embodiment. Thus, where the encoded test signal is a sine wave or other periodic signal, such as a sine wave having frequency $f_o$, as illustrated in FIG. 2, the test signal may be observed above the noise of the analog-to-digital converter in the spectrum produced. As illustrated, because the noise floor of the encoded test signal is below the noise floor of the analog-to-digital converter, it typically, due to noise-shaping, does not interfere with the observation of the test signal above the noise floor of the analog-to-digital converter. Likewise, additional harmonic distortion components, such as $2f_o$ and $3f_o$, are illustrated. These components may, for example, be due to the harmonic distortion (THD) of DAC 250.

Figure 3:
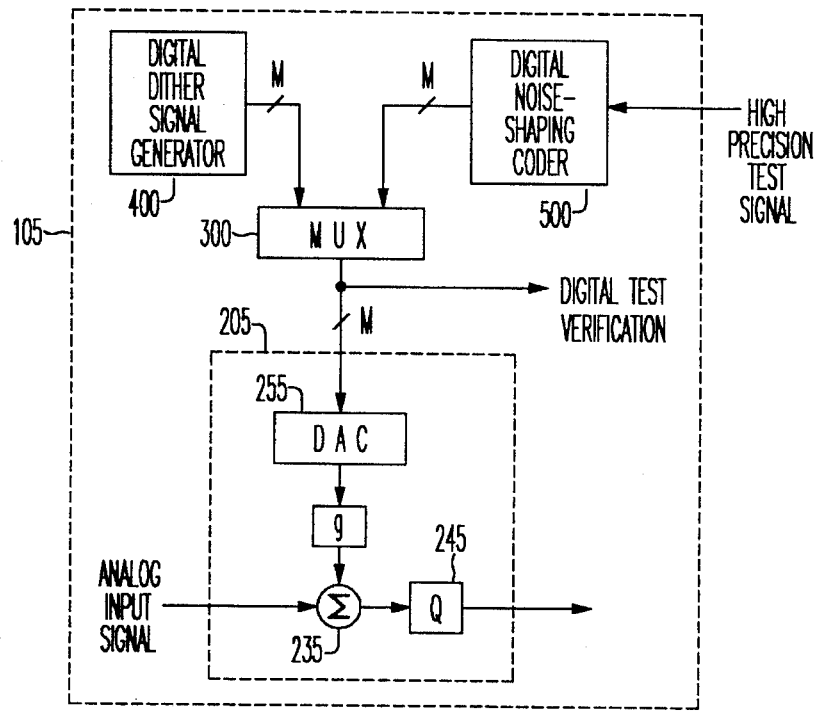
FIG. 3 is a block diagram illustrating an alternative embodiment of a device for testing a dithered analog-to-digital converter in accordance with the invention.

It will now be appreciated that although a device and method for testing a dithered analog-to-digital converter in accordance with the invention may, for example, be employed with a sigma-delta modulator that utilizes a digitally generated dither signal, such as illustrated in FIG. 1, nonetheless, the analog-to-digital converter may comprise a noise-shaping analog-to-digital converter other than a sigma-delta modulator or, in fact, as previously described, any analog-to-digital converter. For example, such an alternative embodiment 105 is illustrated in FIG. 3 by analog-to-digital converter 205 comprising DAC 255, accumulator 235, and conventional quantizer 245. Thus, a variety of non-noise-shaping analog-to-digital converters, such as a flash converter, a successive approximation converter, and others may be employed. It will, however, be appreciated that the frequency spectrum associated with such analog-to-digital converters may not exhibit the same characteristics as the frequency spectrum illustrated in FIG. 2. For example, typically such non-noise-shaping converters may exhibit a flat or uniform noise floor in contrast with the noise floor illustrated in FIG. 2.

Furthermore, as previously described, digital signal processor 500 need not comprise a digital noise-shaping coder. For example, alternatively, it may comprise a digital signal processor producing a digital signal in which the digital signal has been truncated or rounded to M-bits, e.g., a quantizer, so that it may operate in conjunction with an M-bit DAC, such as the DAC illustrated in FIG. 1. In such an embodiment, the test signal, such as a sine wave of frequency $f_o$, may still be seen above the noise floor of the analog-to-digital converter, but it may be difficult to distinguish the harmonic distortion of the DAC from the quantization error distortion introduced in comparison with the previous embodiment in which noise-shaping has been employed. It is likewise desirable to use a periodic signal because for such a signal a substantial amount of the signal energy is concentrated in a relatively narrow frequency range.

Figure 5:
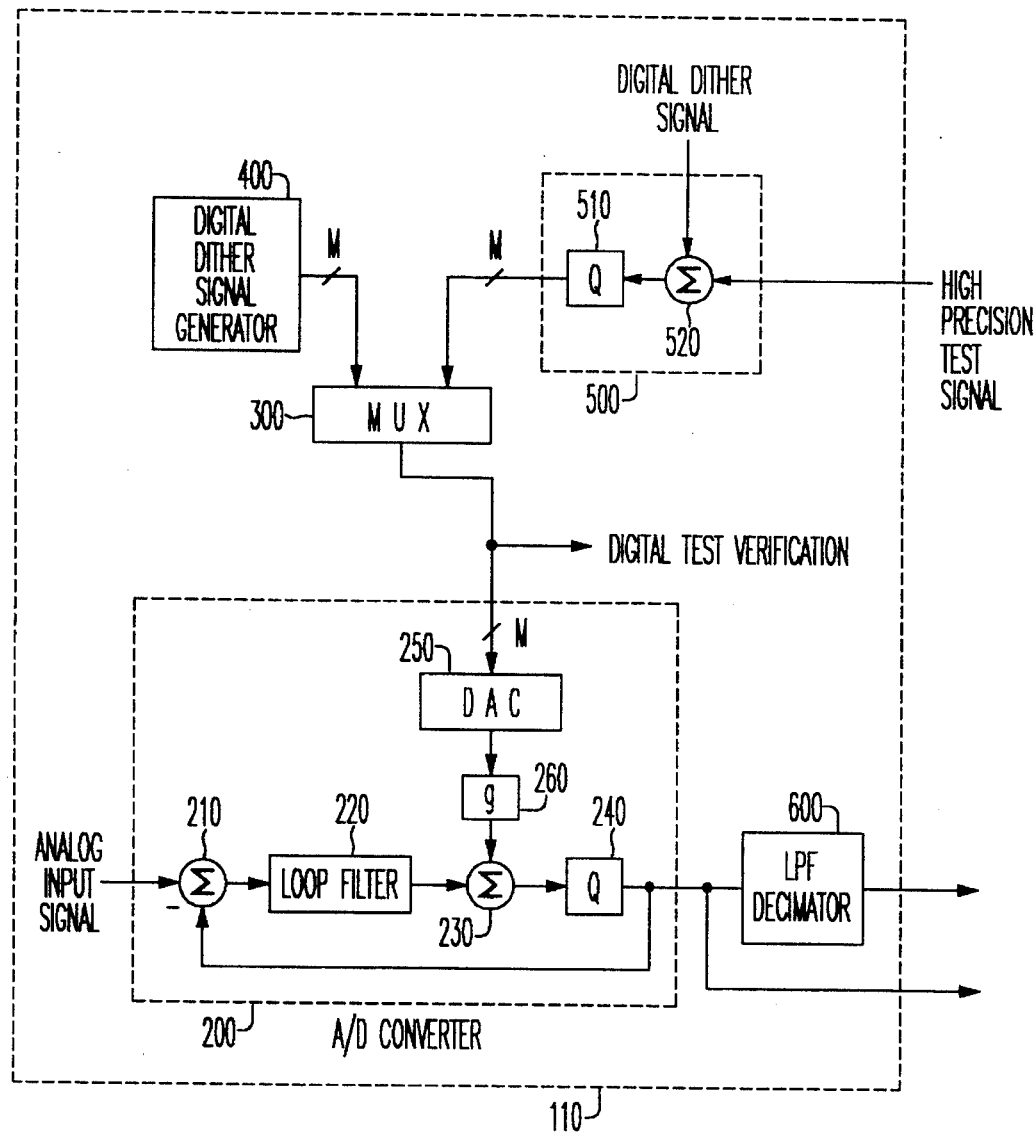
FIG. 5 is a block diagram illustrating yet another alternative embodiment of a device for testing a dithered analog-to-digital converter in accordance with the invention.

Likewise, as illustrated in FIG. 5, in an alternative embodiment 110, a high-precision periodic test signal, such as having more than M-bits, may be superpositioned with a digital dither signal, such as by accumulator 520. The digital dither signal may be produced by generator 400 or alternatively by an external source. This signal may then be quantized, such as by conventional quantizer 510, to produce an M-bit periodic signal. Thus, for example, in the embodiment illustrated in FIG. 5, digital signal processor 500 comprises a dithered M-bit quantizer. One advantage of such an approach is that the desired test signal will be observable in the spectrum, whereas the impact of the harmonic distortion of the DAC will be reduced by the presence of the dither signal.

As previously discussed, digital signal processor 500 may comprise a digital noise-shaping coder and analog-to-digital converter 200 may comprise a sigma-delta modulator. However, in various applications, it may be non-economic to provide two such noise-shaping devices, particularly if one is employed only for the purposes of testing. Alternatively, a noise-shaping coder may be employed separately to generate a digitally encoded, noise-shaped, periodic signal and the encoded signal values produced may then be stored, such as in a ROM or RAM, to provide an encoded test signal to the DAC, such as DAC 250, via a signal coupling device, such as MUX 300. Likewise, the stored signal values need not be noise-shaped, as previously described. In this particular embodiment, illustrated in FIG. 4, therefore, the signal coupling device is adapted to couple a memory storage device 505 for providing generated, digitally encoded, periodic signal values, to the signal path of the analog-to-digital converter instead of coupling a digital signal processor that includes a quantizer to the converter. As illustrated in FIG. 2, these stored periodic signal values have a frequency spectrum with at least one dominant spectral component. Likewise, the signal values may also be dithered, as previously described. Alternatively, it may prove desirable or economic to provide a MUX or other signal coupling device in the path of the dither signal so that the signal path of the analog-to-digital converter may be coupled to a physically separate digital signal processor including a quantizer for such testing purposes.

Figure 4:
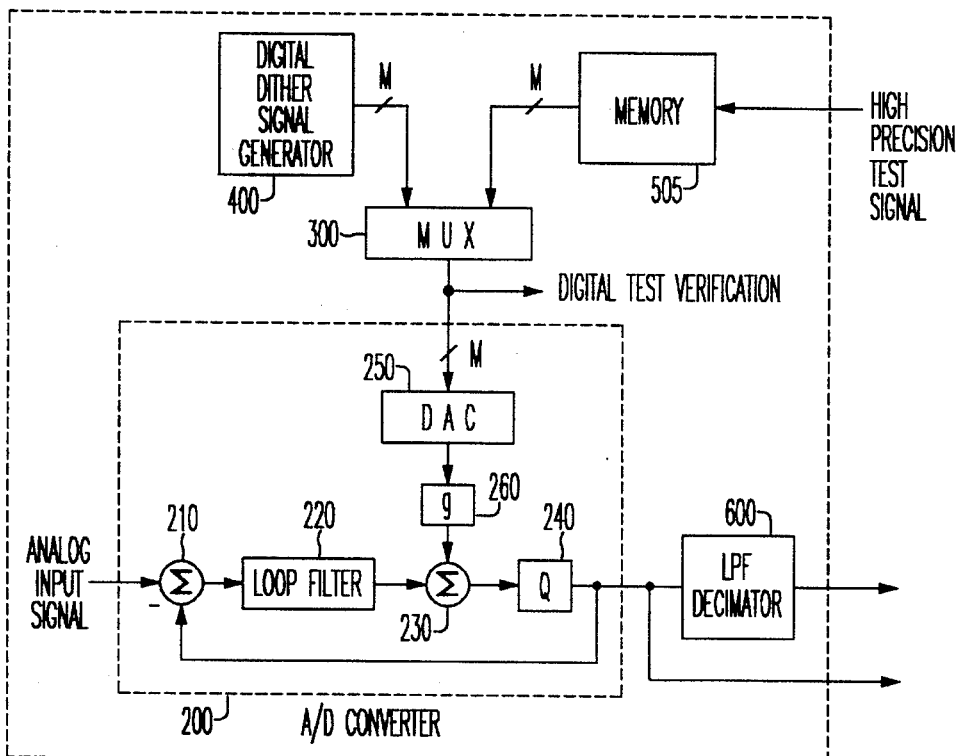
FIG. 4 is a block diagram illustrating another alternative embodiment of a device for testing a dithered analog-to-digital converter in accordance with the invention.

As illustrated in FIG. 1, multiplexer 300 is adapted to selectively couple one of the dither signal generator and the digital signal processor, or alternatively, as illustrated in FIG. 4, memory storage device 505 for providing generated, digitally encoded, periodic signal values, to a predetermined point along the signal path of the analog-to-digital converter between the input port and the output port of the converter. Thus, the embodiment in FIG. 1 illustrates the multiplexer being adapted to selectively couple one of the dither signal generator and the digital signal processor to the signal path immediately ahead of conventional quantizer 240 by providing the output signal of DAC 250, adjusted by gain g, as an input signal to accumulator 230. Nonetheless, it will be appreciated that the invention is not restricted in scope to this respect. For example, as disclosed in the aforementioned U.S. patent application No. 5,144,308, a dither signal may be provided at any point along the signal path of analog-to-digital converter 200. For example, where a multiple loop filter is employed, the dither signal may be provided ahead of an integrator. Nonetheless, as described in aforementioned U.S. Pat. No. 5,144,308, it will be appreciated that in such instances, the dither signal may be "prefiltered" to adjust or compensate for the point along the signal path where the signal is introduced. Likewise, the encoded test signal provided at a point along the signal path, as previously described, may likewise be prefiltered. For example, a prefilter may be implemented at the output port of MUX 300 immediately ahead of DAC 250, although the invention is likewise not limited in scope in this respect.

A dithered analog-to-digital converter, such as illustrated in FIG. 1, may be tested in accordance with the following method. An M-bit periodic digital signal, M being a positive integer, that has been generated may be provided to the dithered converter at a predetermined point along the signal path of the converter in place of the dither signal produced by the dither signal generator. As previously described, the M-bit periodic digital signal may be generated by a digital signal processor including a quantizer immediately before it is provided to the converter. For example, the M-bit periodic signal may be generated by generating an N-bit periodic signal, N being a positive integer greater than M, and then quantizing or requantizing the N-bit signal to produce the M-bit signal. However, alternatively, the M-bit periodic digital signal may be generated and stored, and later provided to the converter, as previously described. Typically, the amplitude of the periodic digital signal is on the order of the amplitude of the dither signal, although for testing purposes amplitudes having a smaller magnitude may also be employed. After providing the generated signal to the dithered converter, the output signal produced by the converter may then be measured. Likewise, the measured output signal may then be converted to a frequency spectrum, such as the frequency spectrum illustrated in FIG. 2.

As previously described, the M-bit periodic digital signal may be quantized by a digital noise-shaping coder, such as, for example, a sigma-delta modulator. Thus, the signal generated may comprise a digitally encoded, noise-shaped, periodic signal. Likewise, the output port of the analog-to-digital converter may be coupled to a decimator, such as decimator 600 illustrated in FIG. 1. In such an embodiment, the step of measuring the output signal produced by the converter may comprise measuring the output signal produced after further processing by the decimator. It will, of course, be appreciated that the filter characteristics of the decimator, if the decimator is used in processing the test signal, are an important consideration in relation to the any noise-shaping characteristics employed in order to reduce any possible aliasing effects in the output signal of the decimator.

While only certain features of the invention have been illustrated and described herein, many modifications, substitutions, changes or equivalents will now occur to those skilled in the art. It is, therefore, to be understood that the appended claims are intended to cover all such modifications and changes as fall within the true spirit of the invention.

We claim:

1. A circuit comprising:

an analog-to-digital converter, having a signal path;

said analog-to-digital converter having the capability to produce an output signal having a noise floor;

a digital signal processor, said digital signal processor having the capability to produce a digital signal having a noise floor below the noise floor of the output signal of said analog-to-digital converter;

a digital dither signal generator; and a signal coupling device adapted to selectively couple one of said dither signal generator and said digital signal processor to the signal path in said converter.

2. The circuit of claim 1, wherein said digital signal processor comprises a digital signal processor that includes a quantizer.

3. The circuit of claim 2, wherein said digital signal processor including a quantizer comprises a digital noise-shaping coder.

4. The circuit of claim 3, wherein said digital noise-shaping coder comprises a sigma-delta modulator.

5. The circuit of claim 2, wherein said analog-to-digital converter comprises a noise-shaping analog-to-digital converter.

6. The circuit of claim 5, wherein said noise-shaping analog-to-digital converter comprises a sigma-delta modulator.

7. The circuit of claim 6, wherein said signal coupling device is adapted to selectively couple one of said dither signal generator and said digital signal processor to a predetermined point along the signal path of said analog-to-digital converter immediately ahead of the quantizer of said sigma-delta modulator.

8. The circuit of claim 5, and further comprising a decimator coupled to the output signal port of said converter.

9. The circuit of claim 2, wherein said signal coupling device comprises means for selectively coupling said dither signal generator and said digital signal processor to the signal path in said converter.

10. The circuit of claim 9, wherein said signal coupling means comprises a multiplexer.

11. The circuit of claim 10, wherein said multiplexer is adapted to selectively couple one of said dither signal generator and said digital signal processor to a predetermined point along the signal path of said analog-to-digital converter between the input signal port and the output signal port.

12. The circuit of claim 2, wherein said digital signal processor comprises an M-bit dithered quantizer.

13. A circuit comprising:

an analog-to-digital converter, said analog-to-digital converter having the capability to produce an output signal having a noise floor;

a digital dither signal generator;

means for providing generated, digitally encoded, signal values having a periodic frequency spectrum with at least one dominant spectral component and a noise floor below the noise floor of the output signal of the analog-to-digital converter; and a signal coupling device adapted to selectively couple one of said dither signal generator and said signal value providing means to the signal path in said converter.

14. The circuit of claim 13, wherein said signal value providing means comprises a memory storage device.

15. The circuit of claim 13, wherein said signal value providing means comprise means for providing generated, digital encoded, noise-shaped, signal values having a periodic frequency spectrum with at least one dominant spectral component.

16. A method of testing a dithered analog-to-digital converter employing an M-bit digital dither signal generator, M being a positive integer, said dithered analog-to-digital converter having the capability to produce an output signal having a noise floor, said method comprising the steps of:

generating an M-bit periodic signal having a noise floor below the noise floor of the output signal of the analog-to-digital converter;

providing the generated signal to said dithered converter at a point along the signal path of said dithered converter in place of the dither signal produced by said dither signal generator; and measuring the digital output signal produced by said converter.

17. The method of claim 16, wherein the step of generating an M-bit periodic signal comprises the steps of:

generating an N-bit periodic signal, N being a positive integer greater than M; and requantizing the N-bit periodic signal to produce an M-bit periodic signal.

18. The method of claim 17, wherein the step of generating an N-bit signal includes:

superpositioning a digital dithered signal.

19. The method of claim 16, and further comprising the step of converting the measured digital output signal to a frequency spectrum.

20. The method of claim 16, wherein the step of generating an M-bit periodic signal comprises generating an M-bit, digitally encoded, noise-shaped, periodic signal.

21. The method of claim 20, wherein the generating step includes storing the M-bit, digitally encoded, noise-shaped, periodic signal.

22. The method of claim 20, wherein the step of generating an M-bit, digitally encoded, noise-shaped, periodic digital signal comprises generating the M-bit, digitally encoded, noise-shaped, periodic signal with a digital noise-shaping coder.

23. The method of claim 20, wherein said dithered converter comprises a sigma-delta modulator;

- said dithered converter further including a decimator coupled to the output signal port of said dithered converter; and
- the step of measuring the output signal produced by said converter comprising measuring the output signal produced after further processing by said decimator.

* * * * *